(12) United States Patent
Wang et al.

(10) Patent No.: US 10,707,221 B2
(45) Date of Patent: Jul. 7, 2020

(54) STEP COVERAGE IMPROVEMENT FOR MEMORY CHANNEL LAYER IN 3D NAND MEMORY

(71) Applicant: Yangtze Memory Technologies Co., Ltd., Wuhan, Hubei (CN)

(72) Inventors: Er Wei Wang, Hubei (CN); Yonggang Yang, Hubei (CN)

(73) Assignee: Yangtze Memory Technologies Co., Ltd., Wuhan, Hubei (CN)

(*) Notice: Subject to any disclaimer, the term of this patent is extended or adjusted under 35 U.S.C. 154(b) by 0 days.

(21) Appl. No.: 16/169,759

(22) Filed: Oct. 24, 2018

(65) Prior Publication Data

US 2020/0098772 A1    Mar. 26, 2020

Related U.S. Application Data

(63) Continuation of application No. PCT/CN2018/107605, filed on Sep. 26, 2018.

(51) Int. Cl.
*H01L 21/332* (2006.01)
*H01L 27/11556* (2017.01)
*H01L 27/11582* (2017.01)
*H01L 27/1157* (2017.01)
(Continued)

(52) U.S. Cl.
CPC .... *H01L 27/11556* (2013.01); *H01L 21/0217* (2013.01); *H01L 21/02164* (2013.01);
(Continued)

(58) Field of Classification Search
CPC ......... H01L 27/11556; H01L 21/02164; H01L 21/02532; H01L 21/0217; H01L 27/1157; H01L 27/11582; H01L 21/3213
(Continued)

(56) References Cited

U.S. PATENT DOCUMENTS 7,192,885 B2 * 3/2007 Hauser ................ C09K 13/08
                                                   216/13
7,922,824 B2    4/2011 Minsek et al.
(Continued)

FOREIGN PATENT DOCUMENTS

CN    101366107 A    2/2009
CN    107994026 A    5/2018
TW    200947613 A1   11/2009

OTHER PUBLICATIONS

International Search Report and Written Opinion of the International Searching Authority directed to related International Patent Application No. PCT/CN2018/107605, dated Jun. 24, 2019; 8 pages.
(Continued)

*Primary Examiner* — Vu A Vu
(74) *Attorney, Agent, or Firm* — Sterne, Kessler, Goldstein & Fox P.L.L.C.

(57) ABSTRACT

Embodiments of an etching method for a material layer of a NAND memory device are disclosed. An example method of chemically etching a material layer on one or more substrates includes mixing an etchant solution within a bath and allowing the etchant solution to reach a quiescent state. After the etchant solution has reached the quiescent state, the method includes loading the one or more substrates into the bath. The one or more substrates includes a plurality of openings having the material layer disposed on an inside surface of the plurality of openings. The method also includes allowing the one or more substrates to remain in the bath for a predetermined time period, such that a thickness of the material layer is reduced by the etchant solution.

20 Claims, 7 Drawing Sheets

(51) Int. Cl.
*H01L 21/3213* (2006.01)
*H01L 21/02* (2006.01)

(52) U.S. Cl.
CPC .... *H01L 21/02532* (2013.01); *H01L 21/3213* (2013.01); *H01L 27/1157* (2013.01); *H01L 27/11582* (2013.01)

(58) Field of Classification Search
USPC ......................................................... 438/137
See application file for complete search history.

(56) References Cited

U.S. PATENT DOCUMENTS

| | | | |
|---|---|---|---|
| 7,927,500 B2* | 4/2011 | Shea | ................. B81C 1/00595 216/99 |
| 2006/0289389 A1 | 12/2006 | Shea | |
| 2009/0127648 A1 | 5/2009 | Chen et al. | |
| 2010/0230757 A1 | 9/2010 | Chen et al. | |
| 2010/0323168 A1 | 12/2010 | Nagahara et al. | |
| 2013/0280887 A1 | 10/2013 | Ricolcol et al. | |
| 2014/0251947 A1* | 9/2014 | Hong | ..................... C03C 15/00 216/17 |
| 2015/0132953 A1 | 5/2015 | Nowling et al. | |
| 2015/0187652 A1 | 7/2015 | Yamamoto et al. | |
| 2018/0006041 A1 | 1/2018 | Xu et al. | |

OTHER PUBLICATIONS

Second Office Action Filed in TW107138920, filed Mar. 16, 2020; 4 pages.

* cited by examiner

STEP COVERAGE IMPROVEMENT FOR MEMORY CHANNEL LAYER IN 3D NAND MEMORY

CROSS-REFERENCE TO RELATED APPLICATIONS

This application claims priority to PCT Patent Application No. PCT/CN2018/107605, filed on Sep. 26, 2018, which is incorporated herein by reference in its entirety.

BACKGROUND

Embodiments of the present disclosure relate to three-dimensional (3D) memory devices and fabrication methods thereof.

Flash memory devices have undergone rapid development. Flash memory devices can store data for a considerably long time without powering (i.e., they are a form of non-volatile memory), and have advantages such as high integration level, fast access, easy erasing, and rewriting. To further improve the bit density and reduce cost of flash memory devices, three-dimensional NAND flash memory devices have been developed.

A three-dimensional NAND flash memory device includes a stack of gate electrodes arranged over a substrate, with a plurality of semiconductor channels through and intersecting word lines, into the p- and/or n-type implanted substrate. The bottom/lower gate electrodes function as bottom/lower selective gates (BSG). The top/upper gate electrodes function as top/upper selective gates (TSG). Back-End-of Line (BEOL) Metal plays the role of Bit-Lines (BLs). The word lines/gate electrodes between the top/upper selective gate electrodes and the bottom/lower gate electrodes function as word lines (WLs). The intersection of a word line and a semiconductor channel forms a memory cell. WLs and BLs are typically laid perpendicular to each other (e.g., in an X-direction and a Y-direction), and TSGs are laid in a direction perpendicular to both the WLs and BLs (e.g., in a Z-direction.)

Chemical etching of semiconductor wafers using wet etchants is commonly performed in the industry to remove various materials, or to etch the semiconductor wafer itself. The wafers to be subjected to the chemical etch are placed in a solution bath containing a particular chemical etchant for a period of time that determines how much material is etched away. It can be challenging to control the etch rate for a given material layer on the wafers after the wafers have been placed into the chemical bath.

BRIEF SUMMARY

Embodiments of three-dimensional memory device architectures and fabrication methods therefore are disclosed herein. The disclosed methods for forming a 3D memory device include an improved etching step that yields a channel layer of a vertical memory structure having an improved step coverage. The channel layer may also be formed using fewer deposition steps compared to conventional channel formation techniques. The improved step coverage ensures continuous coverage of the channel layer along the side walls of high-aspect ratio openings.

In some embodiments, a method of chemically etching a material layer on one or more substrates includes mixing an etchant solution within a bath and allowing the etchant solution to reach a quiescent state. After the etchant solution has reached the quiescent state, the method includes loading the one or more substrates into the bath. The one or more substrates includes a plurality of openings having the material layer disposed on an inside surface of the plurality of openings. The method also includes allowing the one or more substrates to remain in the bath for a predetermined time period, such that a thickness of the material layer is reduced by the etchant solution.

In some embodiments, a method of chemically etching a material layer on one or more substrates includes mixing an etchant solution and placing the etchant solution into a bath. The method includes allowing the etchant solution to reach a quiescent state. After the etchant solution has reached the quiescent state, the method includes loading the one or more substrates into the bath. The method also includes allowing the one or more substrates to remain in the bath for a predetermined time period, such that a thickness of the material layer is reduced by the etchant solution.

BRIEF DESCRIPTION OF THE DRAWINGS

Aspects of the present disclosure are best understood from the following detailed description when reading with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

Any of the memory devices described herein can be used in an electronic system, such as, for example, portable electronics, computers, or wearable electronics.

Figure 1:
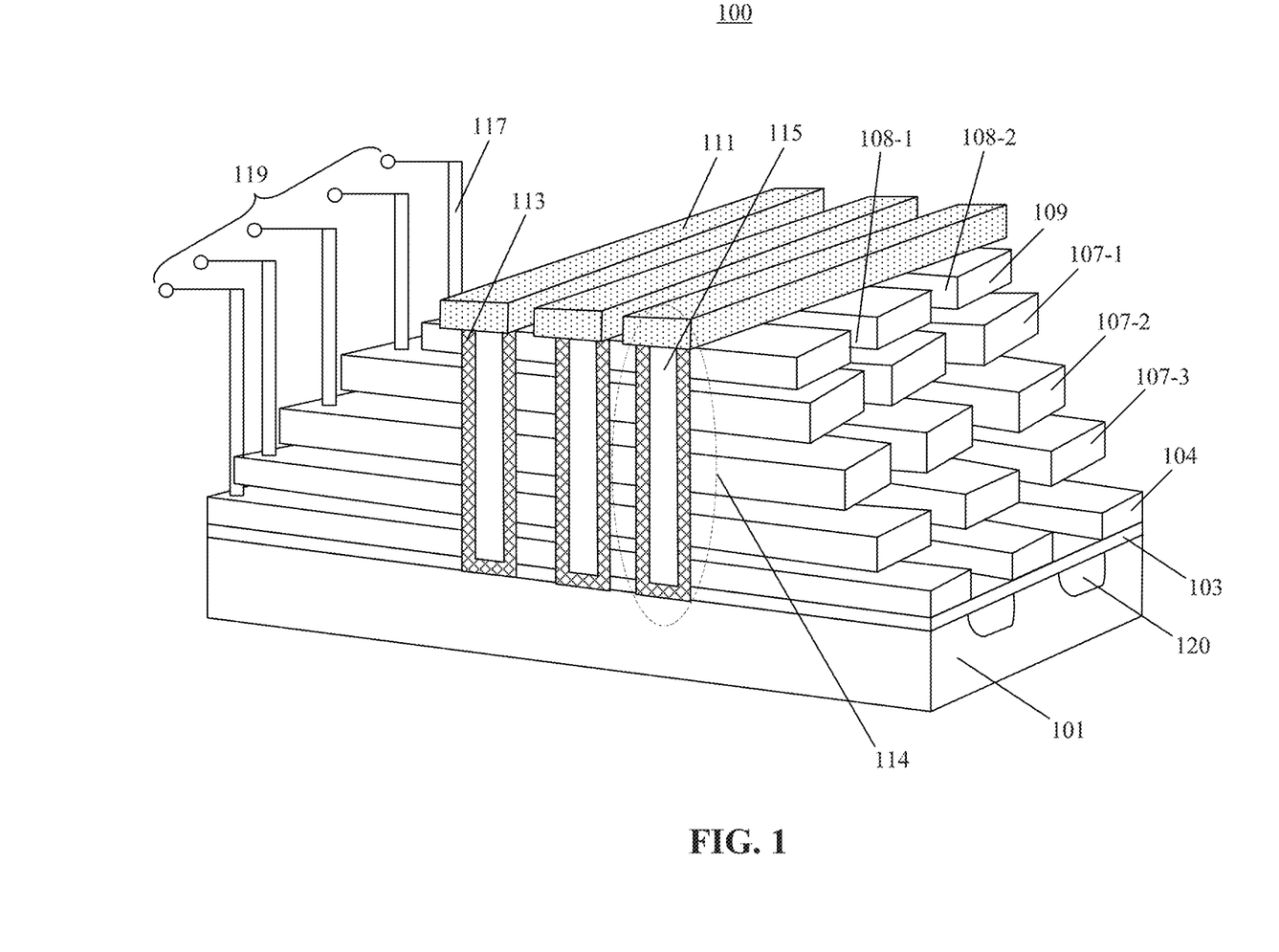
FIG. 1 is an illustration of a three-dimensional memory device.

FIG. 1 illustrates a portion of a three-dimensional NAND flash memory device 100. The flash memory device 100 includes a substrate 101, an insulating layer 103 over substrate 101, a tier of lower selective gate electrodes 104 over the insulating layer 103, and a plurality of tiers of control gate electrodes 107 stacking on top of bottom selective gate electrodes 104 to form an alternating conductor/dielectric stack. The flash memory device also includes a tier of upper selective gate electrodes 109 over the stack of control gate electrodes 107, doped source line regions 120 in portions of substrate 101 between adjacent lower selective gate electrodes 104, and NAND strings 114 through upper selective gate electrodes 109, control gate electrodes 107, lower selective gate electrodes 104, and insulating layer 103. NAND strings 114 includes a memory film 113 over the inner surface of NAND strings 114 and a core filling film 115 surrounded by memory film 113. The flash memory device 100 further includes a plurality of bit lines 111 connected to NAND strings 114 over upper selective gate electrodes 109 and a plurality of metal interconnects 119 connected to the gate electrodes through a plurality of metal contacts 117. Insulating layers between adjacent tiers of gate electrodes are not shown in FIG. 1 for clarity. The gate electrodes include upper selective gate electrodes 109, control gate electrodes 107 (e.g., also referred to as the word lines), and lower selective gate electrodes 104.

In FIG. 1, for illustrative purposes, three tiers of control gate electrodes 107-1, 107-2, and 107-3 are shown together with one tier of upper selective gate electrodes 109 and one tier of lower selective gate electrodes 104. Each tier of gate electrodes have substantially the same height over substrate 101. The gate electrodes of each tier are separated by gate line slits 108-1 and 108-2 through the stack of gate electrodes. Each of the gate electrodes in a same tier is conductively connected to a metal interconnect 119 through a metal contact 117. That is, the number of metal contacts formed on the gate electrodes equals the number of gate electrodes (i.e., the sum of all upper selective gate electrodes 109, control gate electrodes 107, and lower selective gate electrodes 104). Further, the same number of metal interconnects is formed to connect to each metal contact via. In some arrangements, additional metal contacts are formed to connect to other structures beyond the gate electrodes, such as, for example, dummy structures.

When forming NAND strings 114, other vertical structures may also be formed that extend through the tiers of control gate electrodes 107-1, 107-2, and 107-3 down to substrate 101. Examples of other vertical structures include through array contacts (TACs) that may be used to make electrical connection with components above and/or below the tiers of gate electrodes. These other vertical structures are not illustrated in FIG. 1 for clarity.

Figure 2:
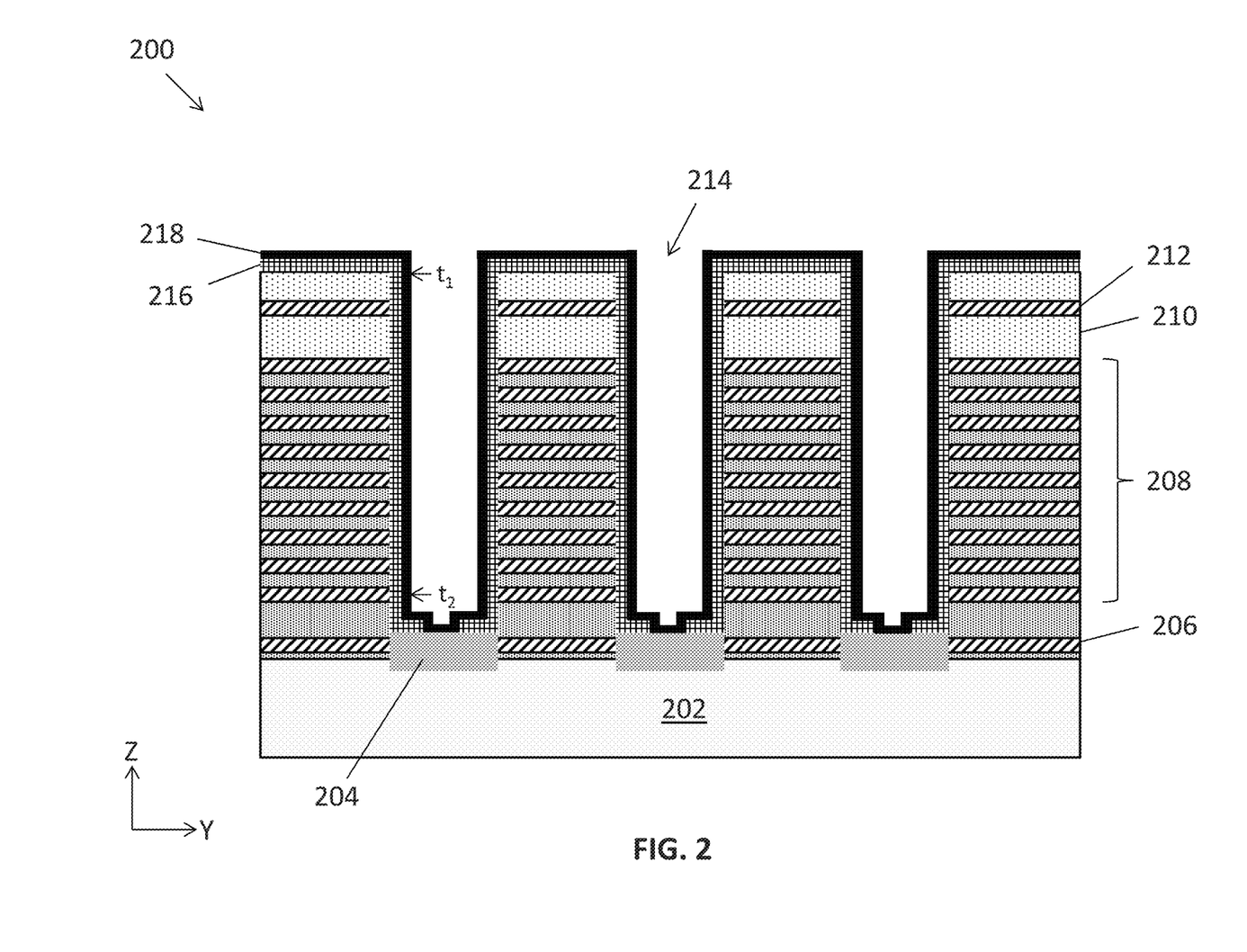
FIG. 2 illustrates a side view of a three-dimensional memory structure at a stage of an exemplary fabrication process, according to some embodiments.

For illustrative purposes, similar or same parts in a three-dimensional NAND device are labeled using same element numbers. However, element numbers are merely used to distinguish relevant parts in the Detailed Description and do not indicate any similarity or difference in functionalities, compositions, or locations. Structure 200 illustrated in FIG. 2 is part of a three-dimensional NAND memory device during an exemplary stage of its fabrication. Other parts of the memory device are not shown for ease of description. Although using three-dimensional NAND devices as examples, in various applications and designs, the disclosed structures can also be applied in similar or different semiconductor devices to, e.g., to provide better step coverage of a material layer deposited into a high-aspect ratio opening. The specific application of the disclosed structures should not be limited by the embodiments of the present disclosure. For illustrative purposes, word lines and gate electrodes are used interchangeably to describe the present disclosure.

FIG. 2 illustrates an exemplary structure 200 of a three-dimensional NAND memory device during an exemplary stage of its fabrication, according to some embodiments. In some embodiments, structure 200 includes a substrate 202. Substrate 202 can provide a platform for forming subsequent structures. Such subsequent structures are formed on a front (e.g., top) surface of substrate 202. And such subsequent structures are said to be formed in a vertical direction (e.g., orthogonal to the front surface of substrate 202.) In FIG. 2, and for all subsequent illustrated structures, the X and Y directions are along a plane parallel to the front and back surfaces of substrate 202, while the Z direction is in a direction orthogonal to the front and back surfaces of substrate 202.

In some embodiments, substrate 202 includes any suitable material for forming the three-dimensional memory device. For example, substrate 202 can include silicon, silicon germanium, silicon carbide, silicon on insulator (SOI), germanium on insulator (GOI), glass, gallium nitride, gallium arsenide, and/or other suitable III-V compound.

In some embodiments, an epitaxially grown material 204 is disposed on various regions of substrate 202. Epitaxially grown material 204 can include epitaxially grown silicon, and may extend into a portion of substrate 202. In some embodiments, epitaxially grown material 204 forms a highly conductive bottom contact for the NAND memory strings which are to be formed above it.

In some embodiments, a first sacrificial dielectric layer 206 is deposited over substrate 202. First sacrificial dielectric layer 206 may include silicon nitride or silicon dioxide. First sacrificial dielectric layer 206 may be vertically distanced from substrate 202 such that it passes through at least a portion of epitaxially grown material 204.

In some embodiments, an alternating sacrificial/dielectric layer stack 208 is formed over first sacrificial dielectric layer 206. The layer stack 208 includes dielectric layers alternating with sacrificial layers. Each of the dielectric layers of layer stack 208 can be silicon oxide, while each of the sacrificial layers of layer stack 208 can be a different dielectric material, such as silicon nitride. Other example materials for each of the dielectric layers or sacrificial layers of layer stack 208 include poly-crystalline silicon, poly-crystalline germanium, and poly-crystalline germanium-silicon. Although only 17 total layers are illustrated in layer stack 208, it should be understood that this is for illustrative purposes only and that any number of dielectric layers may be included in layer stack 208. Another dielectric material 210 is deposited over layer stack 208. A second sacrificial dielectric layer 212 is formed above dielectric material 210, according to some embodiments. Second sacrificial dielectric layer 212 may include silicon nitride or silicon dioxide.

In later fabrication steps not illustrated in this disclosure, the various sacrificial dielectric layers are removed and replaced with a metal. For example, first sacrificial dielectric layer 206 can be removed and replaced with a metal to form a select gate along a bottom portion of the NAND memory strings. In another example, each of the sacrificial layers of layer stack 208 can be removed and replaced with a metal to form word line gates for the NAND memory strings. In yet another example, second sacrificial dielectric layer 212 can be removed and replaced with a metal to form a select gate along a top portion of the NAND memory strings.

According to some embodiments, a plurality of openings 214 extend through layer stack 208 and down to epitaxially grown material 204. Openings 214 are filled with various material layers to ultimately form the vertical NAND memory strings. The exemplary stage of fabrication illustrated in FIG. 2 shows the deposition of a first set of material layers into openings 214.

The first set of material layers includes a plurality of memory layers that are split into insulating layers 216 and channel layer 218 for convenience. Insulating layers 216 includes a plurality of different material layers that can provide a tunneling layer, a storage layer (also known as "charge trap/storage layer"), and a blocking layer for the NAND memory strings. The blocking layer, the storage layer, and the tunneling layer are arranged over one another on the sidewalls of openings 214 in the order listed (with the blocking layer deposited first and the tunneling layer deposited last), according to some embodiments. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, insulating layers 216 includes silicon oxide/silicon nitride/silicon oxide (ONO) dielectrics (e.g., a tunneling layer including silicon oxide, a storage layer including silicon nitride, and a blocking layer including silicon oxide).

Channel layer 218 is disposed over insulating layers 216 along each of the sidewalls of openings 214. Channel layer 218 can be a semiconductor channel layer, such as amorphous silicon, polysilicon, or single crystalline silicon. Due to the high-aspect ratio nature of openings 214, a thickness $t_1$ of channel layer 218 near a top portion of openings 214 is greater than a thickness $t_2$ of channel layer 218 near a bottom portion of openings 214. However, a step coverage (defined herein as the ratio between $t_1$ and $t_2$) of around 1:1 for channel layer 218 is desired. In some embodiments, the thickness $t_1$ is taken from a location along the sidewall of opening 214 adjacent to the top deposited dielectric layer that intersects with opening 214 and the thickness $t_2$ is taken from a location along the sidewall of opening 214 adjacent to the bottom deposited dielectric layer that intersects with opening 214.

Figure 3:
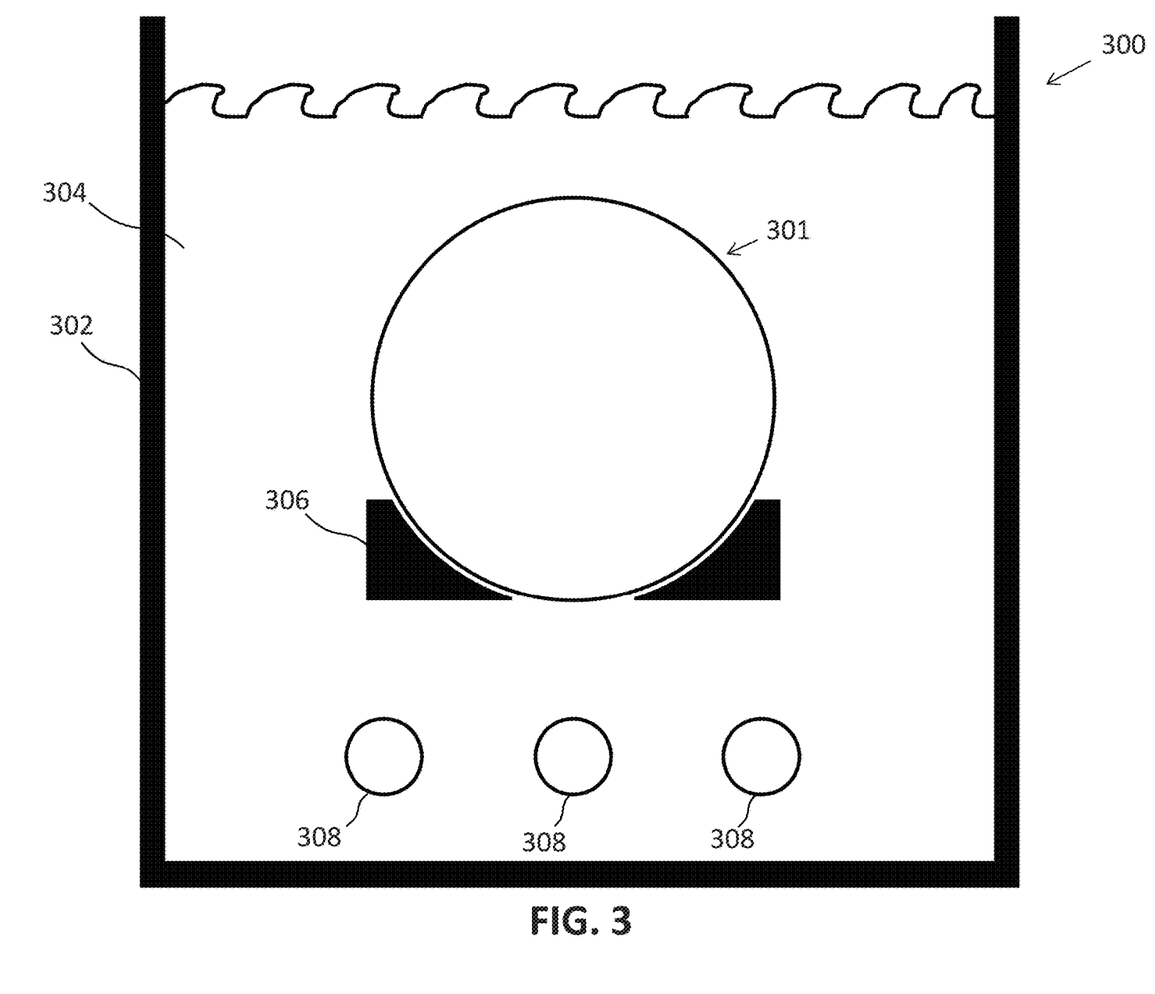
FIG. 3 illustrates a side view of one or more wafers being placed into an etchant bath, according to some embodiments.

In order to control the thickness of channel layer 218 after its deposition, a wet etching process is performed. FIG. 3 illustrates an example etching apparatus 300, that includes a bath 302 containing a solution 304. During operation, one or more wafers 301 are submerged into solution 304. Each of one or more wafers 301 includes a plurality of dies having structures similar to structure 200, according to some embodiments. In some embodiments, one or more wafers 301 are loaded first into a boat structure 306, and boat structure 306 is then lowered into solution 304.

Bath 302 can be dimensioned to receive a large number of wafers at the same time for performing an etching operation. For example, bath 302 can be large enough to receive up to 20 or 25 4-inch or 6-inch wafers at a time, where the wafers are separated from each other by a short distance (e.g., less than 10 mm.)

In a conventional etching operation, etchant solution is provided through pipes 308 and is flown up and over each of wafers 301. The flowing of the etchant solution mixes the solution and helps to drive the etching reaction on wafers 301. However, when this conventional etching technique is used to etch channel layer 218 as shown in structure 200, the etchant solution enters into openings 214 quickly and etches the entire length of channel layer 218 nearly evenly. As a result, a step coverage close to 1:1 for channel layer 218 is very difficult to achieve. In some embodiments, the etchant solution includes a mixture of ammonium, water, and $F_2O_2$ in a ratio of about 1:2:100. Other ratios are possible as well.

According to some embodiments, solution 304 within bath 302 includes a pre-mixed etchant solution. For example, an etchant solution of ammonium, water, and $F_2O_2$ is mixed before wafers 301 are placed into bath 302. After mixing, solution 304 is allowed to reach a quiescent state before wafers 301 are placed into bath 302. A quiescent state is one where the solution is still or substantially still such that no agitation remains. Once the quiescent state is reached, wafers 301 can be dipped into bath 302 for less than 1 minute, less than 45 seconds, or less than 30 seconds.

By premixing the etchant solution and then dipping the wafers into it only after it has reached a quiescent state, the etchant solution does not aggressively fill openings 214, and thus the top portions of openings 214 are etched for a longer period of time compared to the bottom portions of openings 214.

Figure 4A:
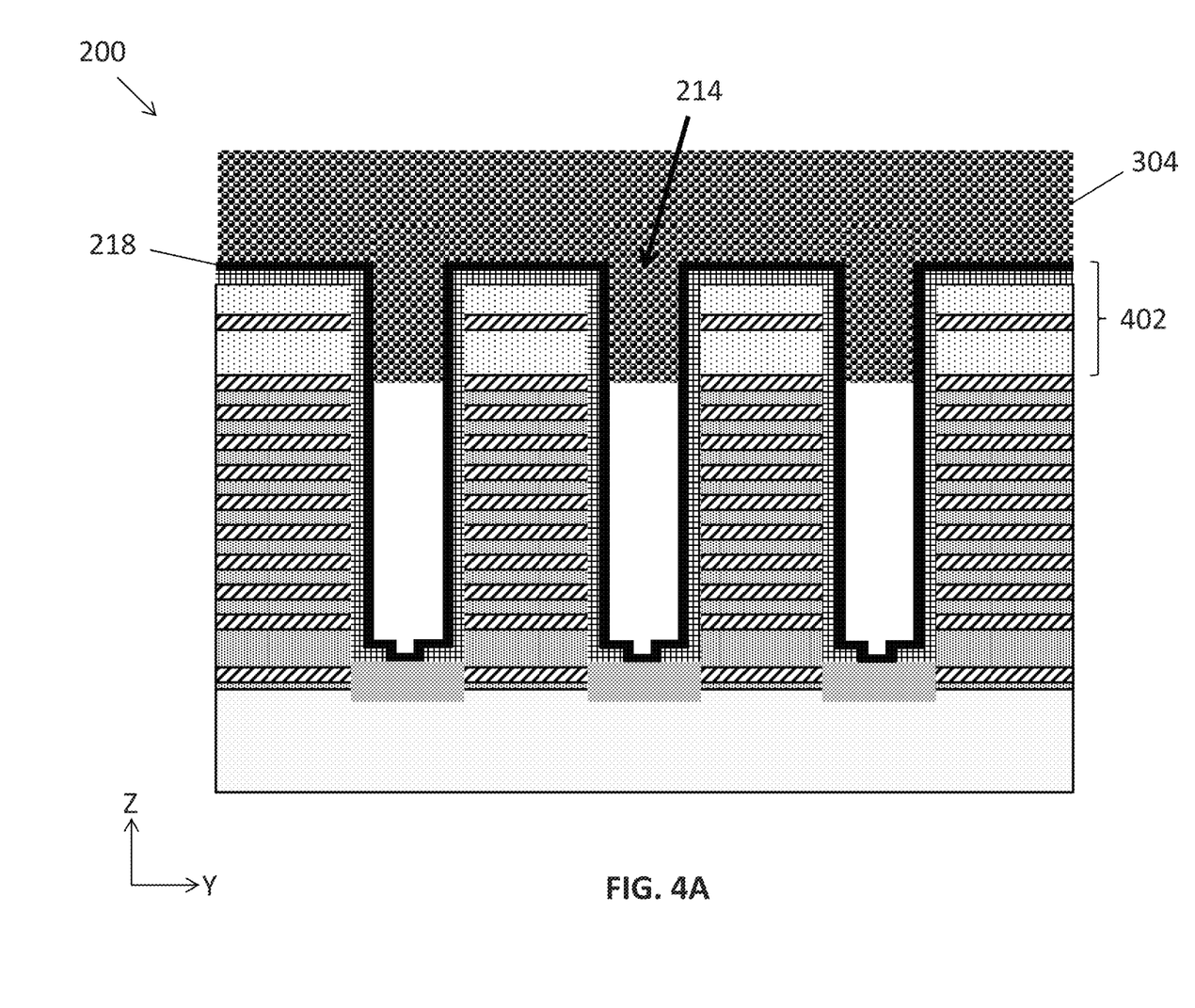
FIGS. 4A-4C illustrate side views of a three-dimensional memory structure at a stage of an exemplary fabrication process during which a layer is being etched, according to some embodiments.
Figure 4B:
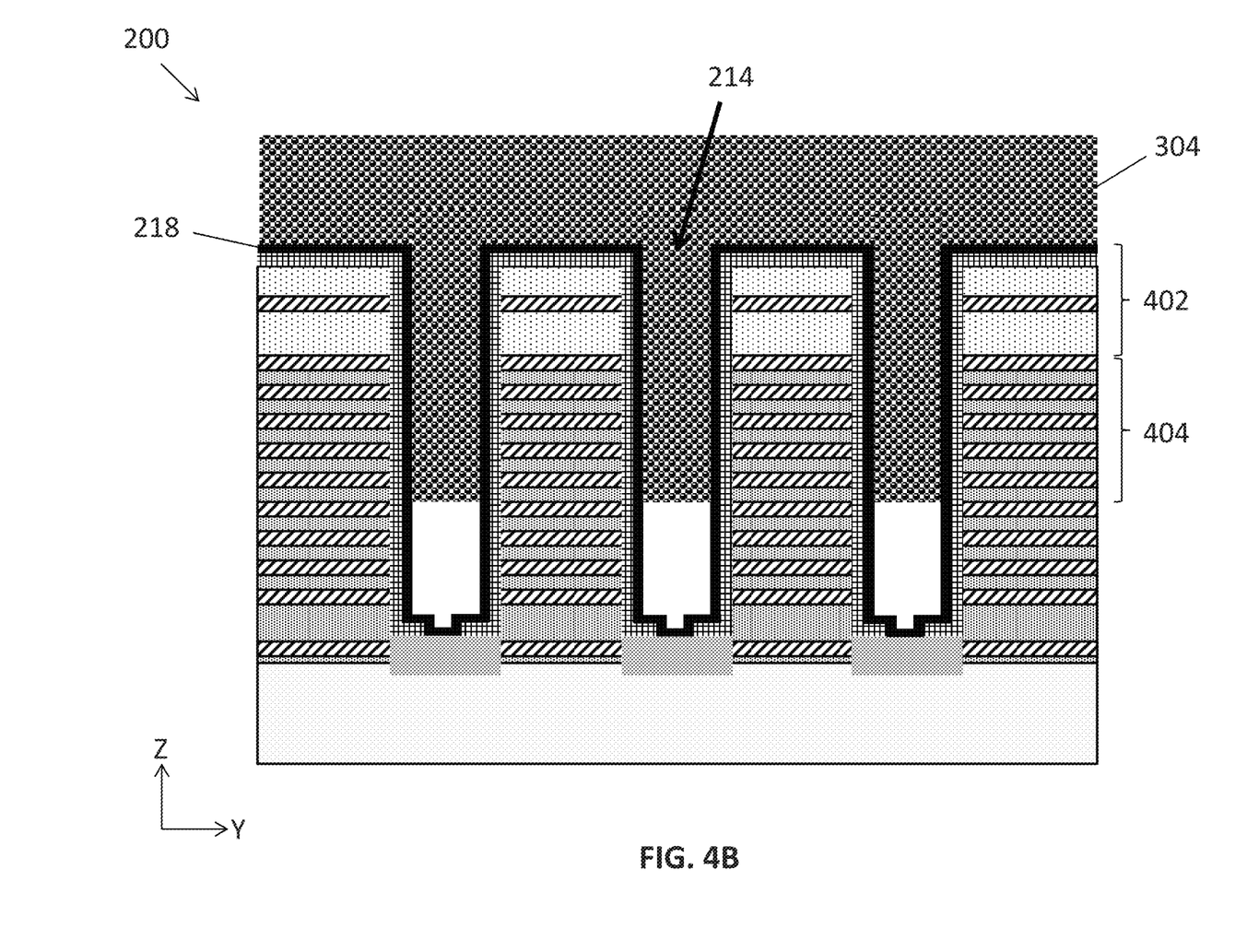
Figure 4C:
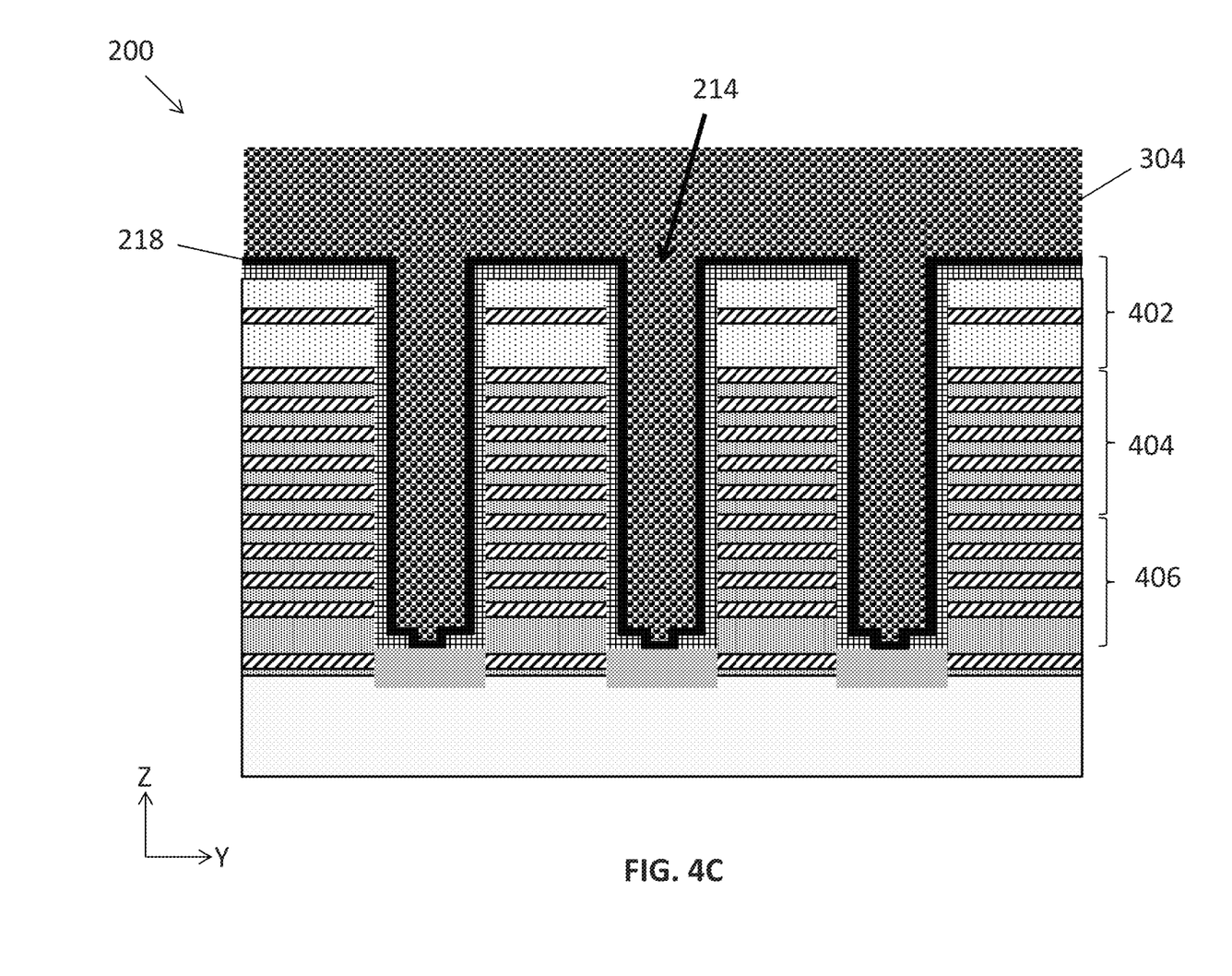

FIGS. 4A-4C illustrate an example wet etching process for channel layer 218, according to some embodiments.

FIG. 4A illustrates structure 200 after wafers 301 have been dipped into a quiescent etchant solution 304, according to some embodiments. At a first time period, etchant solution 304 has penetrated into a top region 402 of openings 214 and thus begins etching the portion of channel layer 218 within top region 402. Because etchant solution 304 is in a quiescent state, the solution moves into openings 214 only via capillary action, according to some embodiments. Thus, the entry of etchant solution 304 into openings 214 is more controlled and slower compared to conventional etching techniques.

FIG. 4B illustrates structure 200 at a second time period after the first time period, according to some embodiments. Etchant solution 304 has penetrated into a middle region 404 of openings 214 and thus begins etching the portion of channel layer 218 within middle region 404 while continuing to also etch the portion of channel layer 218 within top region 402.

FIG. 4C illustrates structure 200 at a third time period after the second time period, according to some embodiments. Etchant solution 304 has penetrated into a bottom region 406 of openings 214 and thus begins etching the portion of channel layer 218 within bottom region 406 while continuing to also etch the portions of channel layer 218 within top region 402 and middle region 404. By etching top region 402 of channel layer 218 for a longer period of time compared with bottom region 406 of channel layer 218, the thickness difference can be equalized or substantially equalized and the final step coverage can be made close to 1:1 for channel layer 218. According to some embodiments, the total time it takes for etchant solution 304 to fill openings 214 is around 10 seconds, around 5 seconds, or around 3 seconds.

Figure 5:
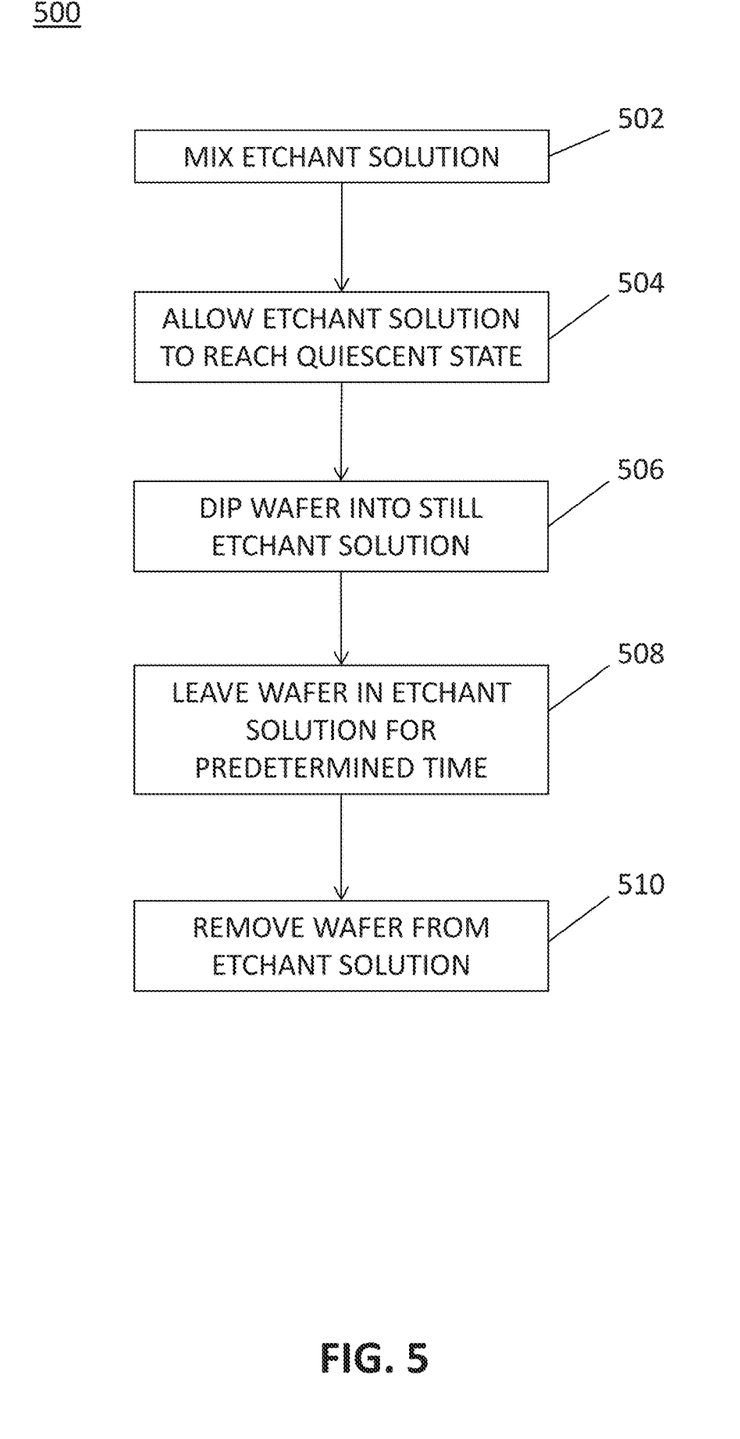
FIG. 5 is an illustration of an etching process involved in the formation of one of the layers of a three-dimensional memory device, according to some embodiments.

FIG. 5 is a flowchart of an exemplary method 500 for etching a material layer in a semiconductor device, according to an embodiment. It should be understood that the operations shown in method 500 are not exhaustive and that other operations can be performed as well before, after, or between any of the illustrated operations. In various embodiments of the present disclosure, the operations of method 500 can be performed in a different order and/or vary.

In operation 502, an etchant solution is mixed before it is introduced to a wafer to be etched using the etchant solution. The etchant solution can contain a ratio of different chemical compounds that are used to selectively etch a particular material. For example, the etchant solution can contain ammonium, water, and $F_2O_2$ in a ratio of about 1:2:100. The etchant solution can be mixed within a bath, or the etchant solution can be mixed outside of the bath, and later placed into the bath.

In operation 504, the etchant solution is allowed to reach a quiescent state. After the etchant solution has been mixed, some duration of time must pass before the solution becomes still and reaches the quiescent state. No further mixing should occur of the etchant solution while it is in the quiescent state.

In operation 506, one or more wafers are dipped into the quiescent etchant solution. The one or more wafers can be dipped into a bath containing the etchant solution. As discussed above with reference to structure 200, each of the one or more wafers can include high aspect ratio openings with a material layer to be etched deposited on the sidewalls of the openings. The material layer can be polysilicon and can have a thickness at a top portion of the openings that is greater than a thickness at a bottom portion of the openings. According to some embodiments, the one or more wafers are dipped carefully into the etchant solution so as to not agitate the solution.

In operation 508, the one or more wafers are left in the etchant solution for a predetermined amount of time. During this time, the etchant solution etches the material layer in a fashion illustrated in FIGS. 4A-4C. Accordingly, a top portion of the material layer within the openings is etched for a longer period of time compared to a bottom portion of the material layer within the openings. The predetermined period of time can be less than 1 minute, less than 45 seconds, or less than 30 seconds.

In operation 510, the one or more wafers are removed from the etchant solution. In some embodiments, the one or more wafers are then washed using, for example, de-ionized water to remove any excess etchant solution from the one or more wafers.

The present disclosure describes various embodiments of an etching method for a material layer of a NAND memory device. An example method of chemically etching a material layer on one or more substrates includes mixing an etchant solution within a bath and allowing the etchant solution to reach a quiescent state. After the etchant solution has reached the quiescent state, the method includes loading the one or more substrates into the bath. The one or more substrates includes a plurality of openings having the material layer disposed on an inside surface of the plurality of openings. The method also includes allowing the one or more substrates to remain in the bath for a predetermined time period, such that a thickness of the material layer is reduced by the etchant.

Another example method of chemically etching a material layer on one or more substrates includes mixing an etchant solution and placing the etchant solution into a bath. The method includes allowing the etchant solution to reach a quiescent state. After the etchant solution has reached the quiescent state, the method includes loading the one or more substrates into the bath. The one or more substrates includes a plurality of openings having the material layer disposed on an inside surface of the plurality of openings. The method also includes allowing the one or more substrates to remain in the bath for a predetermined time period, such that a thickness of the material layer is reduced by the etchant.

Another example method of chemically etching a material layer on one or more substrates includes mixing an etchant solution and placing the etchant solution into a bath. The method includes allowing the etchant solution to reach a quiescent state. After the etchant solution has reached the quiescent state, the method includes loading the one or more substrates into the bath. The method also includes allowing the one or more substrates to remain in the bath for a predetermined time period, such that a thickness of the material layer is reduced by the etchant.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming three-dimensional (3D) NAND memory devices, comprising:
    disposing a dielectric layer stack on a substrate;
    forming a plurality of NAND strings in the dielectric layer stack, the forming comprising:
        disposing a memory layer on inside surfaces of the dielectric layer stack such that one or more openings are surrounded by sidewalk of the memory layer;
        mixing an etchant solution within a bath;
        allowing the etchant solution to reach a quiescent state;
        after the etchant solution has reached the quiescent state, loading the substrate, the dielectric layer stack, and the memory layer into the bath
        allowing the substrate, the dielectric layer stack, and the memory layer to remain in the bath for a predetermined time period, such that the etchant solution moves into the one or more openings by capillary action and a thickness of the memory layer is non-uniformly reduced by the etchant solution; and
        disposing a core filling film in the one or more openings after the thickness of the memory layer is reduced; and
    disposing bit lines over the dielectric layer stack, wherein the bit lines are connected to the plurality of NAND strings.

2. The method of claim 1, wherein mixing the etchant solution comprises mixing a solution containing ammonium, water, and $F_2O_2$.

3. The method of claim 1, wherein the etchant solution contains a 1:2:100 ratio of ammonium to water to $F_2O_2$.

4. The method of claim 1, wherein the etchant solution fills the one or more openings in about five seconds.

5. The method of claim 1, wherein the memory layer comprises polysilicon.

6. The method of claim 1, wherein the memory layer has a first thickness at a top portion of the one or more openings and a second thickness at a lower portion of the one or more openings, the first thickness being greater than the second thickness, before the substrate, the dielectric layer stack, and the memory layer are loaded into the bath.

7. The method of claim 6, wherein the first thickness is substantially the same as the second thickness after the predetermined time period.

8. The method of claim 1, further comprising:
    removing the substrate, the dielectric layer stack, and the memory layer from the bath; and
    washing the substrate, the dielectric layer stack, and the memory layer to remove any excess etchant solution.

9. The method of claim 1, wherein the disposing a memory layer comprises disposing an insulating layer on the inside surfaces of the dielectric layer stack and disposing a channel layer on the insulating layer.

10. A method for forming one or more three-dimensional (3D NAND memory devices, comprising:
    disposing an alternating layer stack on a substrate, the substrate comprising at least one epitaxial conductive structure formed thereon;
    disposing a plurality of memory layers, wherein:
        a first portion of the plurality of memory layers is formed on sidewalls of the alternating layer stack;
        a second portion of the plurality of memory layers is formed on the at least one epitaxial conductive structure; and
        the first and second portions of the plurality of memory layers define one or more openings between the sidewalls of the alternating layer stack;

mixing an etchant solution;
placing the etchant solution into a bath;
allowing the etchant solution to reach a quiescent state;
after the etchant solution has reached the quiescent state, loading the substrate, the alternating layer stack, and the plurality of memory layers into the bath; and
allowing the substrate, alternating layer stack, and the plurality of memory layers to remain in the bath for a predetermined time period, such that the etchant solution moves into the one or more openings by capillary action and a thickness of the plurality of memory layers is non-uniformly reduced by the etchant solution.

11. The method of claim 10, wherein mixing the etchant solution comprises mixing a solution containing ammonium, water, and $F_2O_2$.

12. The method of claim 10, wherein the etchant solution contains a 1:2:100 ratio of ammonium to water to $F_2O_2$.

13. The method of claim 10, wherein the etchant solution fills the one or more openings in about five seconds.

14. The method of claim 10, wherein the plurality of memory layers comprises polysilicon.

15. The method of claim 10, wherein a first thickness at a top portion of the first portion of the plurality of memory layers is greater than a second thickness at a lower portion of the plurality of the first portion of the plurality of memory layers, before the substrate, the alternating layer stack, and the plurality of memory layers are loaded into the bath.

16. The method of claim 15, wherein the first thickness is substantially the same as the second thickness after the predetermined time period.

17. The method of claim 10, wherein the predetermined time period is less than 1 minute.

18. The method of claim 10, further comprising:
removing the substrate the alternating layer stack, and the plurality of memory layers from the bath; and
washing the substrate, the alternating layer stack, and the plurality of memory layers to remove any excess etchant solution.

19. The method of claim 10, wherein disposing the plurality of memory layers comprises etching the alternating layer stack to form an opening that exposes a portion of the at least one epitaxial conductive structure.

20. The method of claim 19, wherein the disposing the plurality of memory layers comprises disposing an insulating layer on inside surfaces of the opening and disposing a channel layer on the insulating layer.

* * * * *

UNITED STATES PATENT AND TRADEMARK OFFICE
CERTIFICATE OF CORRECTION

PATENT NO. : 10,707,221 B2
APPLICATION NO. : 16/169759
DATED : July 7, 2020
INVENTOR(S) : Wang et al.

Page 1 of 1

It is certified that error appears in the above-identified patent and that said Letters Patent is hereby corrected as shown below:

In the Claims

In Column 10, Line 9, Claim 1 replace "are surrounded by sidewalk" with --are surrounded by sidewalls--.

In Column 10, Line 55, Claim 10 replace "(3D NAND memory" with --(3D) NAND memory--.

In Column 12, Line 1, Claim 15 replace "of the plurality of the first portion" with --of the first portion--.

In Column 12, Line 10, Claim 18 replace "removing the substrate the alternating layer stack" with --removing the substrate, the alternating layer stack--.

Signed and Sealed this
Eleventh Day of August, 2020

Andrei Iancu
*Director of the United States Patent and Trademark Office*